(12) United States Patent
Iwata et al.

(10) Patent No.: US 9,231,010 B2
(45) Date of Patent: Jan. 5, 2016

(54) PHOTOELECTRIC CONVERSION APPARATUS AND IMAGING SYSTEM HAVING IMPURITY CONCENTRATION PROFILE IN A DEPTH DIRECTION OF THE PLURAL SEMICONDUCTOR REGIONS

(71) Applicant: CANON KABUSHIKI KAISHA, Tokyo (JP)

(72) Inventors: Junji Iwata, Tokyo (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 68 days.

(21) Appl. No.: 14/245,844

(22) Filed: Apr. 4, 2014

(65) Prior Publication Data
US 2014/0299746 A1  Oct. 9, 2014

(30) Foreign Application Priority Data
Apr. 8, 2013 (JP) ................................. 2013-080805

(51) Int. Cl.
*H01L 31/00* (2006.01)
*H01L 27/146* (2006.01)

(52) U.S. Cl.
CPC ........ *H01L 27/1463* (2013.01); *H01L 27/1461* (2013.01); *H01L 27/14607* (2013.01)

(58) Field of Classification Search
CPC ..................... H01L 27/1463; H01L 27/14607; H01L 27/14806; H01L 31/03529; H01L 31/075

USPC ....... 250/214.1, 239, 214 R, 208.1; 257/290–292, 440–444, 432–436; 348/294–311

See application file for complete search history.

(56) References Cited

U.S. PATENT DOCUMENTS 6,507,055 B1 * 1/2003 Kim ............................. 257/222

FOREIGN PATENT DOCUMENTS

JP  2001-250931 A  9/2001

* cited by examiner

*Primary Examiner* — Que T Le
(74) *Attorney, Agent, or Firm* — Canon USA, Inc. IP Division

(57) ABSTRACT

A photoelectric conversion unit has first semiconductor regions and a second semiconductor region that is disposed between the first semiconductor regions being adjacently disposed in the unit. Impurity concentration profile in a depth direction of the first and semiconductor regions has a plurality of peaks. The impurity concentration peaks of the first semiconductor region include a first impurity concentration peak and a second impurity concentration peak being lower than the first impurity concentration peak. The impurity concentration peaks of the second semiconductor region include a third, a fourth, and a fifth impurity concentration peak. The fourth impurity concentration peak is higher than the third impurity concentration peak, and a fifth impurity concentration peak is higher than the third impurity concentration peak. The depth of the third impurity concentration peak is closer to the depth of the second impurity concentration peak than that of the first impurity concentration peak.

20 Claims, 16 Drawing Sheets

CHARGES

CHARGES MOVING →

FIG. 8A
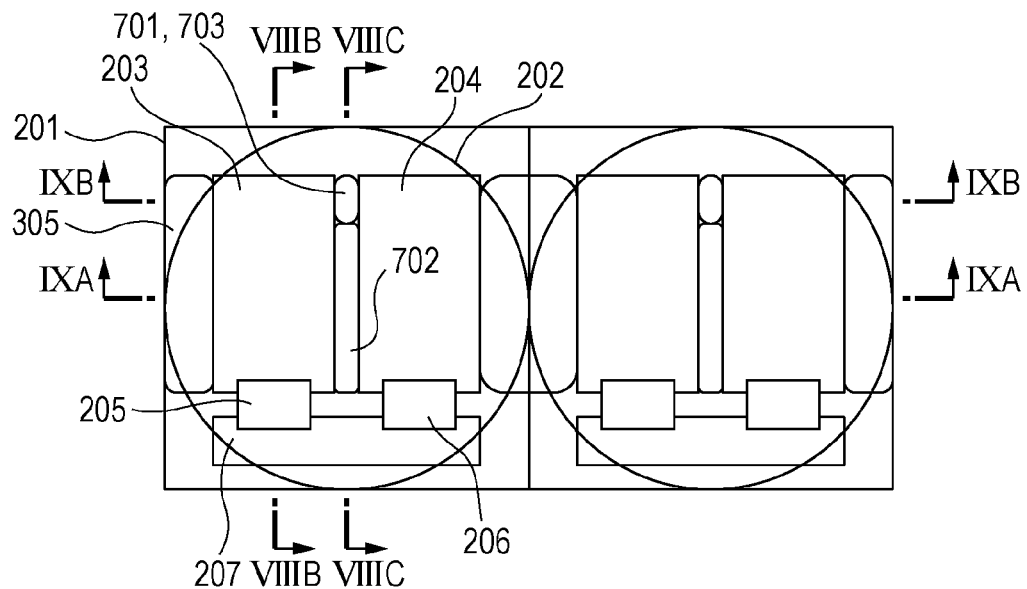
FIG. 8B
FIG. 8C
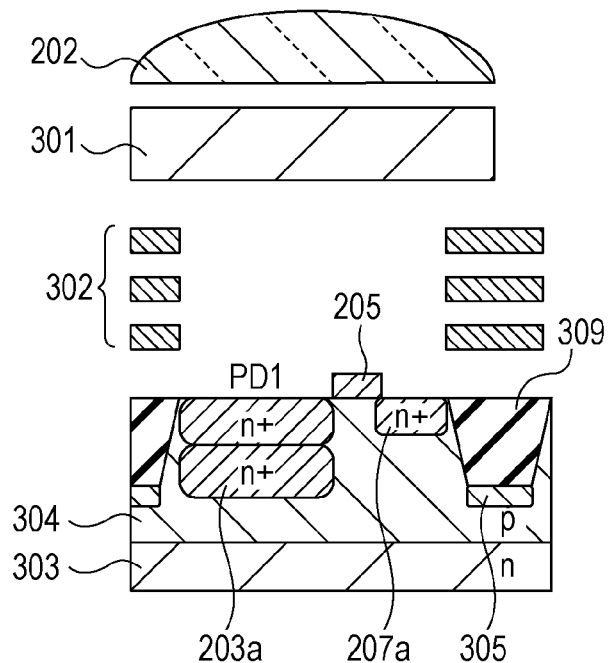
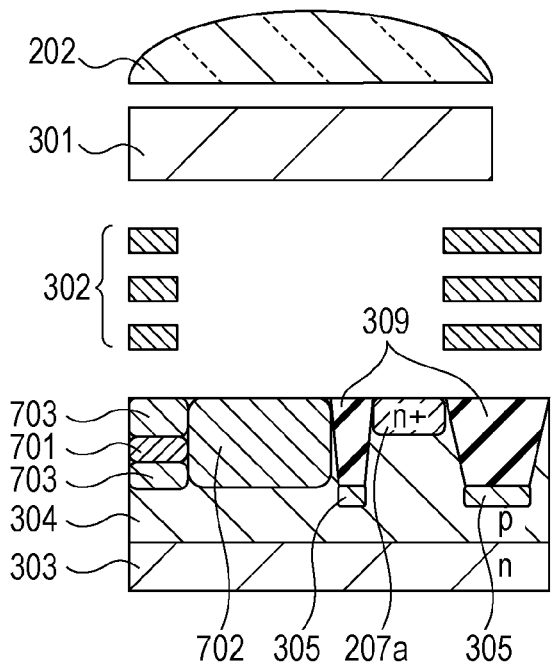

PHOTOELECTRIC CONVERSION APPARATUS AND IMAGING SYSTEM HAVING IMPURITY CONCENTRATION PROFILE IN A DEPTH DIRECTION OF THE PLURAL SEMICONDUCTOR REGIONS

BACKGROUND OF THE INVENTION

1. Field of the Invention

One disclosed aspect of the embodiments relates to a photoelectric conversion apparatus, and it particularly relates to a separation structure between photoelectric conversion elements.

2. Description of the Related Art

In the past, signals generated by a plurality of photoelectric conversion elements may have been processed as a signal from one pixel in a photoelectric conversion apparatus. For example, there is a technology that gathers light to a plurality of photoelectric conversion elements through one micro lens for performing phase difference focus detection. As disclosed in Japanese Patent Laid-Open No. 2001-250931, for example, signals obtained from photoelectric conversion elements that receive light passing through one micro lens are read independently for focus detection and combined into one signal for image processing.

When signals of a plurality of photoelectric conversion elements are processed as a signal of one pixel and if the plurality of photoelectric conversion elements differ in sensitivity and incident light quantity, it may be difficult to acquire a proper signal therefrom. Particularly, photoelectric conversion elements may be neighboring to various elements, and different separation structures may be used between those adjacent elements. In such a case, a proper signal may not be acquired.

SUMMARY OF THE INVENTION

According to one disclosed aspect of the embodiments, a proper separation structure is formed between a plurality of photoelectric conversion elements so that one desirable signal may be acquired from the photoelectric conversion elements.

According to one disclosed aspect of the embodiments, there is provided a photoelectric conversion apparatus having a plurality of photoelectric conversion units, each including a plurality of photoelectric conversion elements, the apparatus including a first semiconductor region of a first conductivity type configured to collect signal charges in each of the plurality of photoelectric conversion elements, and a second semiconductor region of a second conductivity type between the first semiconductor regions of the photoelectric conversion elements that are included in a photoelectric conversion unit and are disposed adjacent to each other, wherein the first semiconductor region has a plurality of impurity concentration peaks arranged at different depths from each other, the second semiconductor region has a plurality of impurity concentration peaks arranged at different depths from each other, the plurality of impurity concentration peaks in the first semiconductor region include a first impurity concentration peak, a second impurity concentration peak having a lower impurity concentration than that the first impurity concentration peak has, the plurality of impurity concentration peaks in the second semiconductor region include a third impurity concentration peak, a fourth impurity concentration peak having a higher impurity concentration than that the third impurity concentration peak has, and arranged on a surface side of the third impurity concentration peak, and a fifth impurity concentration peak having a higher impurity concentration than that the third impurity concentration peak has, and arranged on a deeper side of the third impurity concentration peak, and a difference between the depth where a region corresponding to the third impurity concentration peak is formed and the depth where a region corresponding to the second impurity concentration peak is formed is smaller than a difference between the depth where the third impurity concentration peak is formed and the depth where a region corresponding to the first impurity concentration peak is formed.

Further features of the disclosure will become apparent from the following description of exemplary embodiments with reference to the attached drawings.

BRIEF DESCRIPTION OF THE DRAWINGS

FIGS. 8A to 8C schematically illustrate a top face and section structures of a photoelectric conversion apparatus according to a second exemplary embodiment.

DESCRIPTION OF THE EMBODIMENTS

Figure 1A:
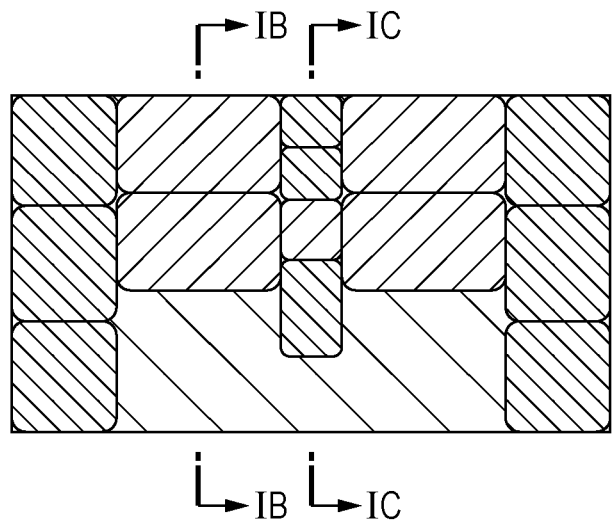
FIGS. 1A to 1C schematically illustrate section views of a photoelectric conversion apparatus according to one embodiment.
Figure 1B:
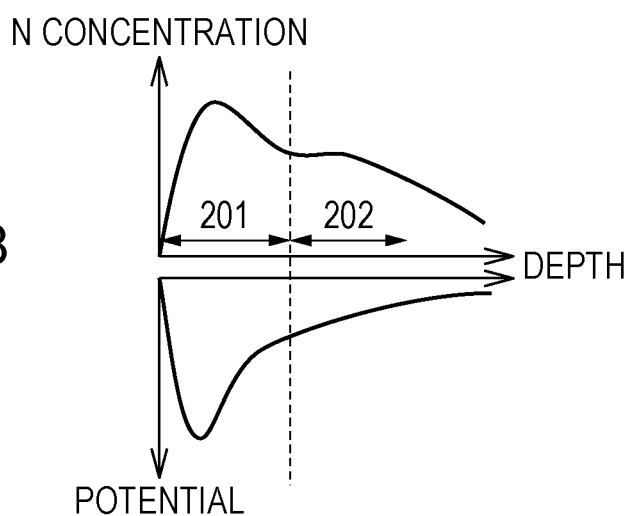
Figure 1C:
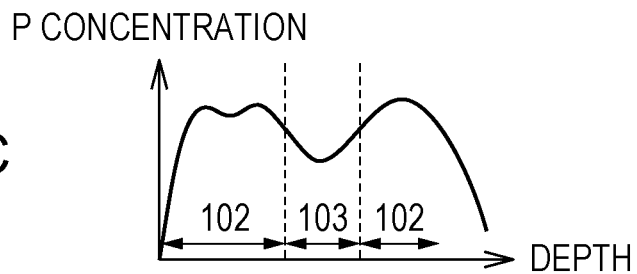

An exemplary embodiment of the disclosure will be described with reference to FIGS. 1A to 1C. FIG. 1A is a section view of one photoelectric conversion unit in a photoelectric conversion apparatus according to one exemplary embodiment. FIG. 1B illustrates a positional relationship between depths of impurity concentration peaks taken at Line IB-IB and potential states. FIG. 1C illustrates a positional relationship of depths having impurity concentration peaks taken at Line IC-IC. Here, electrons are used as signal carriers, for example, in the following description. The term "surface" herein refers to a face where a transistor is provided. The term "depth" refers to a distance in a direction toward the opposite face of the surface with respect to the surface.

A photoelectric conversion unit according to this exemplary embodiment has two photoelectric conversion elements. Because the photoelectric conversion elements have similar configurations, one of the photoelectric conversion elements will be described, for example, and components of the other photoelectric conversion element will only be indicated by reference numerals within parentheses.

Each of the photoelectric conversion elements has a first semiconductor region having an N-type semiconductor region 1A (1C) and an N-type semiconductor region 1B (1D). The first semiconductor region is capable of functioning as a region for collecting signal charges. The first semiconductor region has a plurality of impurity concentration peaks 1a (1c), 1b (1d) arranged at different depths. The plurality of impurity concentration peaks have a first impurity concentration peak 1a (1c) and a second impurity concentration peak 1b (1d) having a lower impurity concentration than that the first impurity concentration peak 1a (1c) has.

In this case, the N-type semiconductor regions 1A, 1B may be considered as a region corresponding to the first impurity concentration peak, and a region corresponding to the second impurity concentration peak. These regions are illustrated separately here but may be formed integrally. Among semiconductor regions formed through different production processes, semiconductor regions formed under one production condition may be counted as one semiconductor region, for example. The same is true in the following description.

A second semiconductor region having P-type semiconductor regions 1E_1, 1E_2, 1F, and 1G are provided between the two photoelectric conversion elements. The second semiconductor region has a plurality of impurity concentration peaks 1e_1, 1e_2, 1f, and 1g arranged at different depths from each other. Four peaks are illustrated here but existence of at least three peaks may be required.

Three impurity concentration peaks may have a third impurity concentration peak 1f, a fourth impurity peak 1e_1 having a higher impurity concentration than it and arranged closer to the surface, and a fifth impurity concentration peak (1g) having a higher impurity concentration than that the third impurity concentration peak 1f has and arranged at a deeper position than it.

This exemplary embodiment is characterized in that a depth where the third impurity concentration peak 1f of the second semiconductor region is arranged is closer to a depth where the second impurity concentration peak 1b of the first semiconductor region is arranged than a depth where the first impurity concentration peak 1a of the first semiconductor region is arranged.

This characteristic may improve the number of saturation charges in the first photoelectric conversion element. Satisfaction of such a relationship between the N-type semiconductor regions 1C and 1D in the second photoelectric conversion element may also improve the number of saturation charges in the second photoelectric conversion element.

Referring to FIG. 1B, impurity concentration peaks having higher impurity concentrations is arranged closely to the surface of the first semiconductor region, and impurity concentration peaks having lower concentration peak values are arranged on the deeper side. This configuration may improve the charge transfer efficiency of depletion transfer of charges to a floating diffusion region by using a transfer gate. However, without limiting thereto, an impurity concentration peak having a high impurity concentration may be arranged on a deeper side.

Having described the case that the number of the impurity concentration peaks is equal to two according to this exemplary embodiment, an embodiment is not limited thereto. At least two impurity concentration peaks having different impurity concentrations may be required, and there may be many impurity concentration peaks. In such a case, a depth where the third impurity concentration peak 1f of the second semiconductor region is arranged is closer to a depth of another impurity concentration peak than the depth of an impurity concentration peak having the highest impurity concentration among a plurality of impurity concentration peaks of the first semiconductor region.

Next, a block diagram will be described which is applicable to a photoelectric conversion apparatus according to one embodiment. An imaging apparatus will be described here as an example of the photoelectric conversion apparatus. Instead of such an imaging apparatus, the disclosure is applicable to any apparatus that uses photoelectric conversion.

Figure 2:
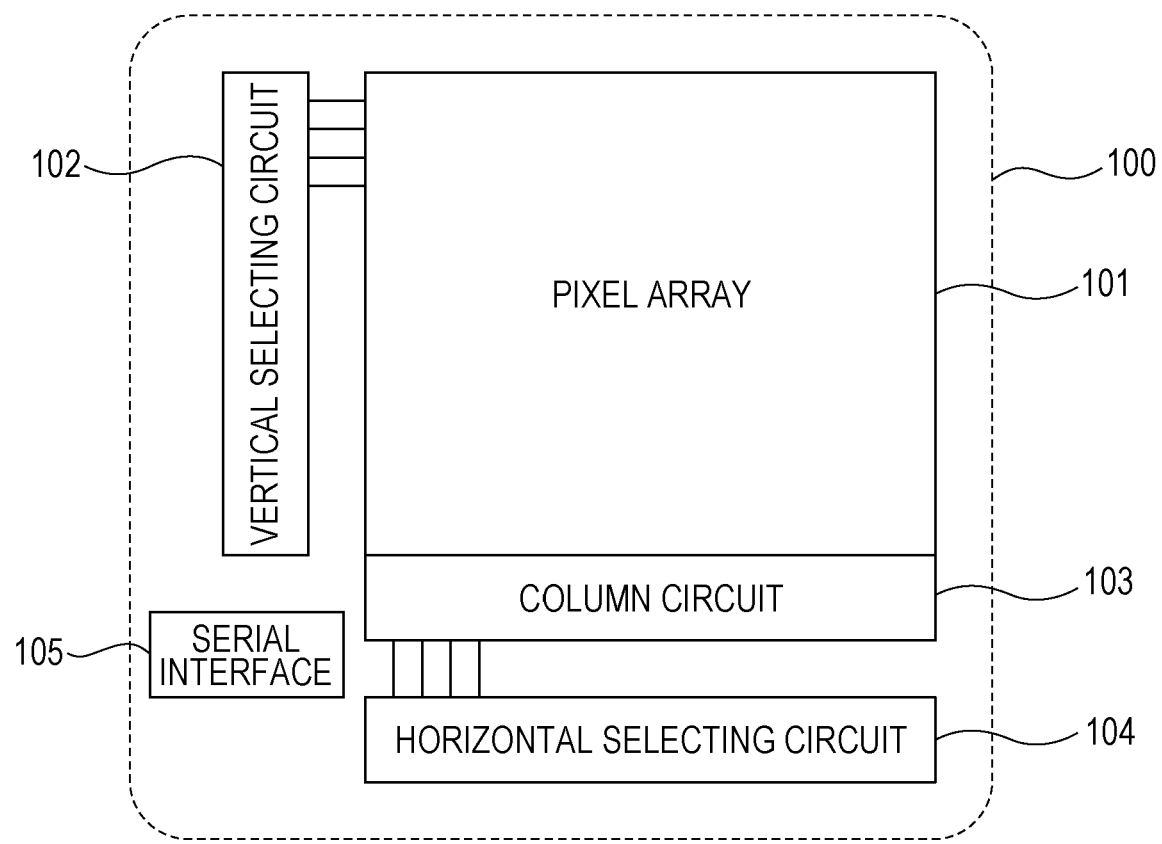
FIG. 2 schematically illustrates a general configuration of a photoelectric conversion apparatus according to one embodiment.

FIG. 2 schematically illustrating an imaging apparatus according to one embodiment. Referring to FIG. 2, an imaging apparatus 100 includes a pixel array 101 and a vertical selecting circuit 102 configured to select a row in the pixel array 101. The pixel array 101 has a plurality of photoelectric conversion units. The plurality of photoelectric conversion units may be arranged two-dimensionally.

The vertical selecting circuit 102 selects a predetermined row, and signals from photoelectric conversion units included in the predetermined row are output to a vertical output line. A plurality of vertical output lines may be provided for each column, every plurality of columns, or for each pixel column.

The column circuit 103 receives signals read in parallel to a plurality of vertical output lines. The column circuit 103 is capable of performing a process such as signal amplification, signal analog-digital conversion, and noise reduction.

A horizontal selecting circuit 104 sequentially selects signals held in the column circuit 103 and outputs them to a horizontal output line, not illustrated. A serial interface 105 may communicate with outside for external determination of an operation mode, for example. It should be noted that the imaging apparatus 100 may further include a timing generator or control circuit configured to provide timing to the vertical selecting circuit 102, horizontal selecting circuit 104, and/or column circuit 103, for example, in addition to the illustrated components.

The block diagram in FIG. 2 is applicable to all of following exemplary embodiments. The terms "vertical" and "horizontal" are used for convenience of description, and they may be interchanged.

Figure 16A:
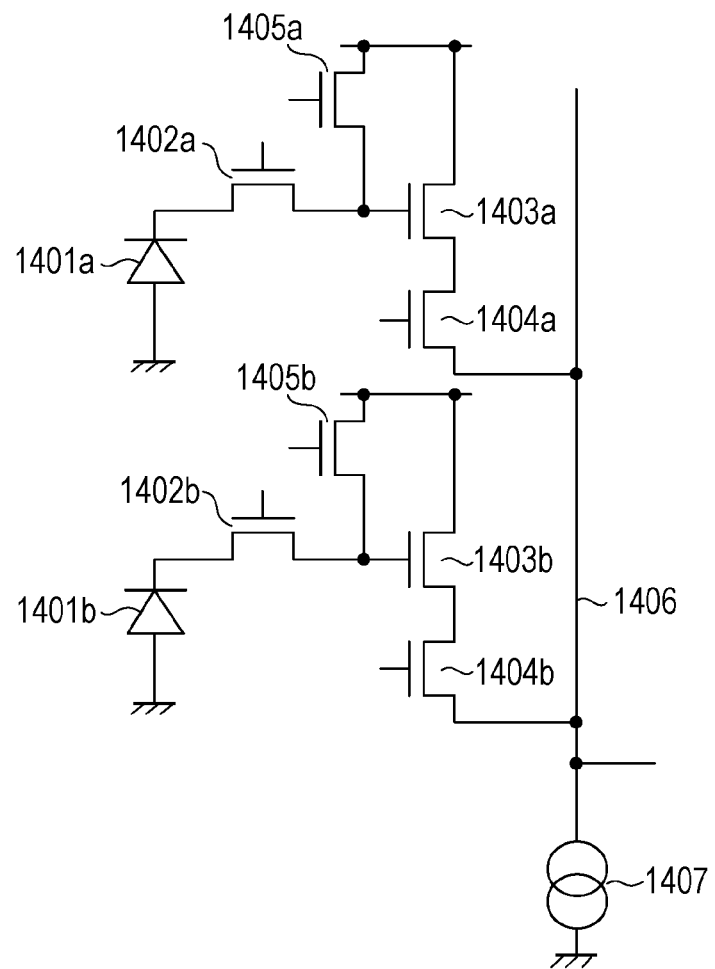
FIGS. 16A and 16B are equivalent circuit diagrams of photoelectric conversion units that are applicable to one embodiment.
Figure 16B:
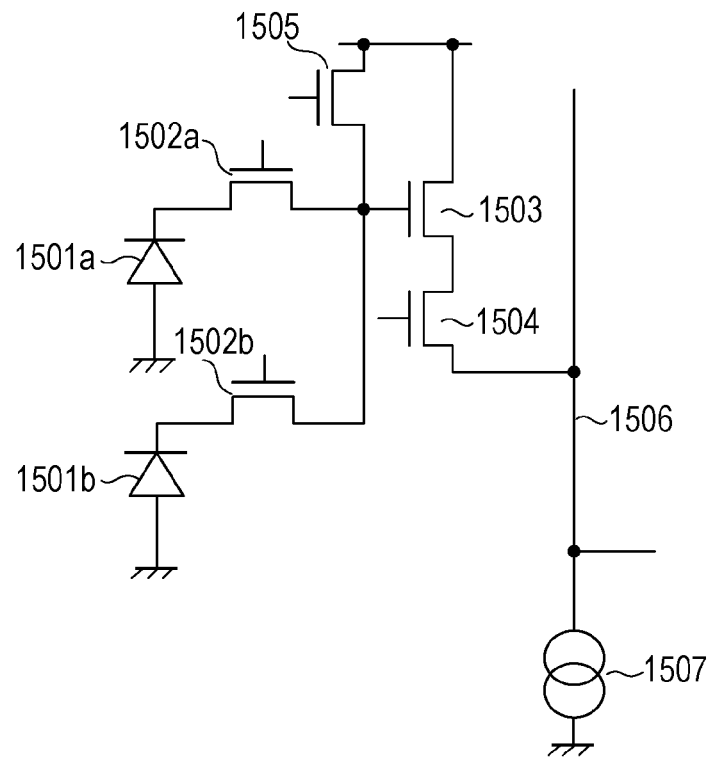

Next, FIGS. 16A and 16B illustrate examples of an equivalent circuit of the photoelectric conversion unit. FIG. 16A illustrates an example in which transistors having different functions from each other for their corresponding photoelectric conversion elements are provided individually. FIG. 16B illustrates an example in which transistors having different functions from each other are commonly provided for a plurality of photoelectric conversion elements.

Charges occurring in photoelectric conversion elements 1401a and 1401b are transferred to input nodes of amplification transistors 1403a, 1403b through transfer transistors 1402a and 1402b. Each of the input nodes of the amplification transistors may include a gate of the amplification transistor and a floating diffusion region electrically connected thereto. In response to supply of a pulse that turns on selection transistors 1404a and 1404b to gates of the selection transistors 1404a and 1404b, signals according to the input nodes of the amplification transistors are output to the vertical output line 1406. Reset transistors 1405a and 1405b set voltages of the input nodes of the amplification transistors 1403a and 1403b to a predetermined voltage. In this circuit arrangement, the selection transistors 1404a and 1404b are turned on exclusively, and signals of the photoelectric conversion elements 1401a and 1401b may thus be read to a column circuit and be added, for example, for imaging and focus detection.

Next, the configuration illustrated in FIG. 16B will be described. A basic operation thereof is similar to the operation of the one illustrated in FIG. 16A. Charges occurring in photoelectric conversion elements 1501a and 1501b are transferred to input node of an amplification transistor 1503 through transfer transistors 1502a and 1502b. The input node of the amplification transistor 1503 may include a gate of the amplification transistor and a floating diffusion region electrically connected thereto. In response to supply of a pulse that turns on a selection transistor 1504 to a gate of the selection transistor 1504, a signal according to the input node of the amplification transistor 1503 is output to a vertical output line 1506. A reset transistor 1505 sets voltage of the input node of the amplification transistor 1503 to a predetermined voltage. Referring to FIG. 16B, because the amplification transistor 1504 is shared by the plurality of photoelectric conversion elements 1501a and 1501b, signals may be added in the input node of the amplification transistor. Thus, the signal after the addition may be output from the photoelectric conversion unit to the vertical output line 1406.

A specific exemplary embodiment will be described below for explanation of a configuration of a photoelectric conversion apparatus according to one embodiment. An imaging apparatus will be described as an example of the photoelectric conversion apparatus in the following exemplary embodiments. The term "impurity concentration" simply refers to a net impurity concentration compensated by an impurity of an opposite conductivity type, that is, what is called a NET concentration. A region where a P-type added impurity concentration is higher than an N-type added impurity concentration is a P-type semiconductor region. Conversely, a region where an N-type added impurity concentration is higher than a P-type added impurity concentration is an N-type semiconductor region.

First Exemplary Embodiment

Figure 3:
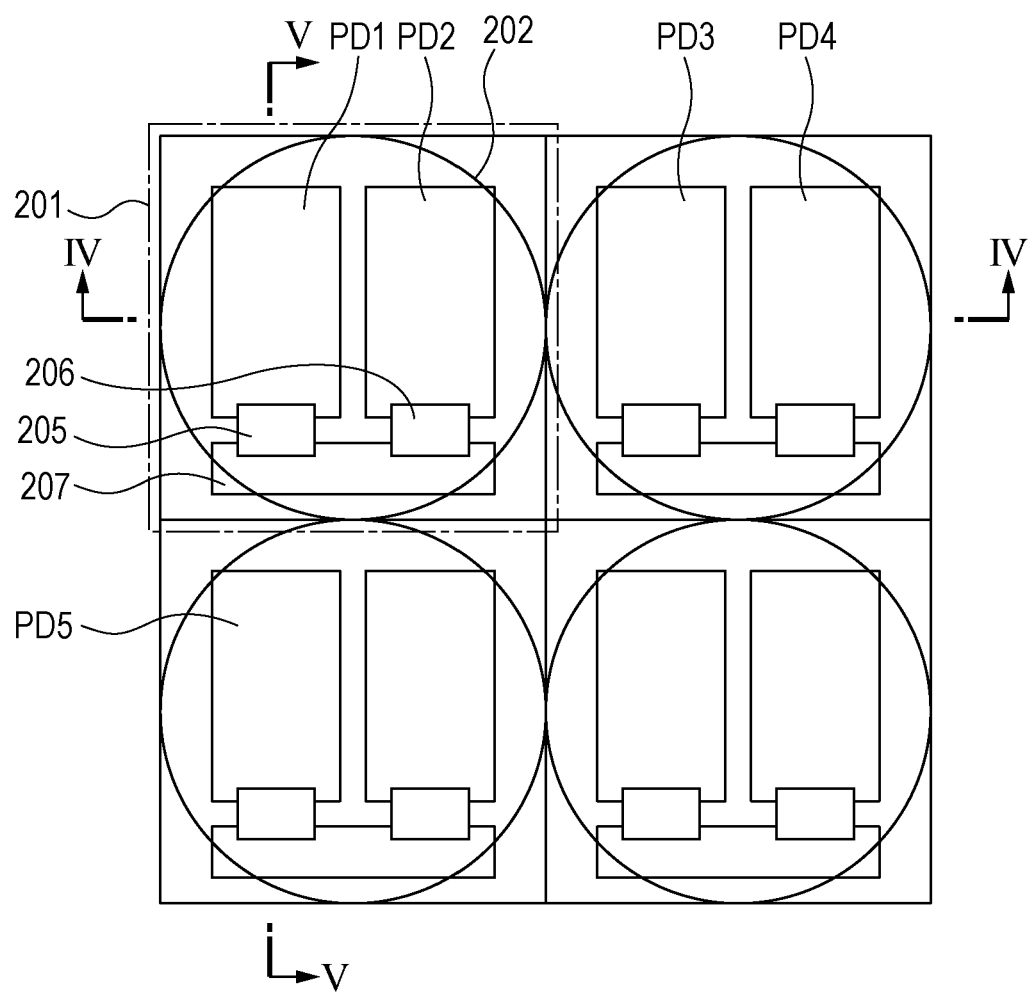
FIG. 3 schematically illustrates a top face of a photoelectric conversion apparatus according to a first exemplary embodiment.

FIG. 3 is a schematic diagram illustrating a top face of a photoelectric conversion unit in an imaging apparatus 100 according to a first exemplary embodiment. FIG. 3 illustrates four photoelectric conversion units 201 each arranged in 2 rows and 2 columns.

One micro lens 202 is provided for one photoelectric conversion unit. One photoelectric conversion unit 201 has a plurality of photoelectric conversion elements. In FIG. 3, two photoelectric conversion elements PD1 and a PD2 are provided, for example. Alternatively, one photoelectric conversion unit may internally have four photoelectric conversion elements and nine photoelectric conversion elements.

Transfer gates 205 and 206 that are gates of transfer transistors transfer charges occurring in the photoelectric conversion elements PD1 and PD2 to a floating diffusion region 207. The floating diffusion region 207 is sharable by the plurality of photoelectric conversion elements PD1 and PD2.

While FIG. 3 illustrates four photoelectric conversion units for convenience of description, the pixel array 101 may further includes further more photoelectric conversion units 201 in a matrix form.

Figure 4A:
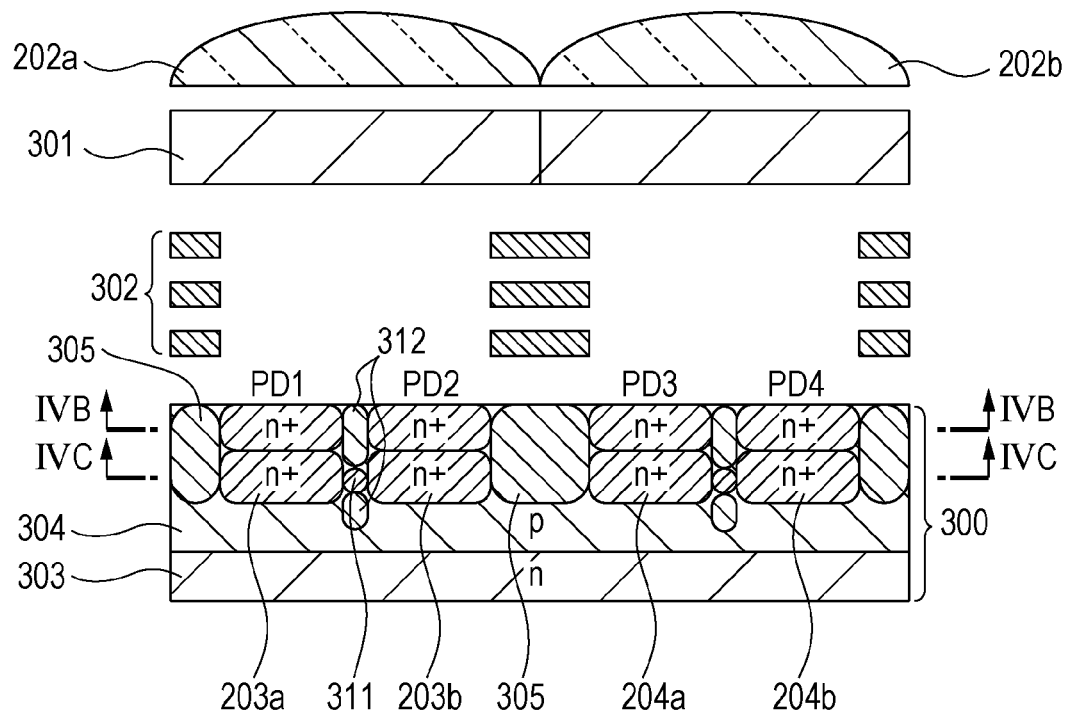
FIGS. 4A to 4C schematically illustrate a section structure and potential profiles of the photoelectric conversion apparatus according to the first exemplary embodiment.

FIG. 4A illustrates a section structure of a photoelectric conversion unit according to this exemplary embodiment. FIG. 4A further illustrates a color filter 301 and a wiring layer 302. Three wiring layers disposed at different heights are illustrated here.

A P-type semiconductor region 304 and a plurality of N-type semiconductor regions 203 and 204 form a PN junction. The P-type semiconductor region 304 is disposed on a semiconductor region 303. The semiconductor region 303 may be a P-type semiconductor substrate or an N-type semiconductor substrate, for example.

Each of the photoelectric conversion elements includes the N-type semiconductor regions 203 and 204 and the P-type semiconductor region 304. More specifically, the P-type semiconductor region 304 and N-type semiconductor regions 203a and 203b configure the photoelectric conversion elements PD1 and PD2 (hereinafter, called PD1 and PD2). The P-type semiconductor region 304 and N-type semiconductor regions 204a and 204b configure photoelectric conversion elements PD3 and PD4 (hereinafter called PD3 and PD4). The N-type semiconductor regions 203a and 203b and 204a and 204b are regions having a low potential for electrons and collecting signal charges. A P-type semiconductor region may be provided on the plane of incidence side of the N-type semiconductor regions 203a, 203b, 204a, and 204b to be a pinned type photodiode. Light condensed by a micro lens 202a enters to the PD1 and PD2 while light condensed by a micro lens 202b enters to the PD3 and PD4. These semiconductor regions are provided on a semiconductor substrate 300. FIG. 4A illustrates as if the N-type semiconductor regions 203a, 203b, 204a, and 204b are configured by two semiconductor regions formed at different depths. FIG. 4A exemplarily illustrates that the semiconductor regions have impurity concentration peaks at different depths, as will be described below. Therefore, the semiconductor regions may be integrally formed as one semiconductor region. Alternatively, the semiconductor regions may be stacked in a depth direction through a plurality of production processes.

The PD1 and PD2 receive light condensed by the same micro lens 202a. The PD1 and PD2 are included in the same photoelectric conversion unit. The PD1 and PD2 are adjacent to each other in one direction, that is, right to left direction in FIG. 4A. The photoelectric conversion unit including the PD1 and PD2 will be called first photoelectric conversion units. A photoelectric conversion unit adjacent to the first photoelectric conversion unit in the right direction in FIG. 4 will be called a second photoelectric conversion unit.

A first part formed of P-type semiconductor region 311 and a second part of formed of P-type semiconductor region 312 are provided between the N-type semiconductor regions 203a, 203b included in the PD1 and PD2, respectively. The P-type semiconductor regions 311 and 312 are capable of functioning as a potential barrier for electrons between the N-type semiconductor regions 203a and 203b.

The PD2 and PD3 receive light beams condensed by different micro lenses 202a and 202b, respectively. The PD2 and PD3 are included in different photoelectric conversion units from each other and are adjacent to each other. The PD2 and PD3 are disposed adjacent to each other in one direction, that is, the right and left direction in FIG. 4A. A P-type semiconductor region 305 is provided between the N-type semiconductor regions 203b and 204a included in the PD2 and PD3, respectively. The provided P-type semiconductor region 305 is capable of functioning as a potential barrier for electrons between the N-type semiconductor region 203b and N-type semiconductor region 204a.

In FIG. 4A, a P-type semiconductor region provided between two PDs within one photoelectric conversion unit has a plurality of impurity concentration peaks arranged at different depths. FIG. 4A illustrates a configuration in which an impurity concentration peak corresponding to the first part 311 is arranged between impurity concentration peaks corresponding to the second part 312. In this case, the impurity concentration peak value of the first part 311 is lower than the impurity concentration peak value of the second part 312.

The first part 311 is formed at a predetermined depth from the surface of the semiconductor substrate 300. The second part 312 is formed on and under the first part 311. The P-type impurity concentration of the first part 311 is lower than the P-type impurity concentration of the P-type semiconductor region 305. The P-type impurity concentration of the second region 312 is equal to or lower than the P-type impurity concentration of the P-type semiconductor region 305. Preferable impurity concentration values of impurity concentration peaks of the N-type semiconductor regions 203a, 203b, 204a, and 204b and depths where they are arranged will be described below. A similar condition to that which will be described is applicable to all photoelectric conversion elements. More specifically, a value of impurity concentration of an impurity concentration peak arranged on a surface side may be in a range equal to or higher than $3E16$ $cm^{-3}$ and equal to or lower than $1E18$ $cm^{-3}$. A depth of an impurity concentration peak arranged on a surface side may be in a range equal to 0.18 μm and equal to or lower than 0.4 μm. A value of impurity concentration of an impurity concentration peak arranged on a deeper side may be in a range equal to or higher than $6E15$ $cm^{-3}$ and equal to or lower than $1E17$ $cm^{-3}$. A depth of an impurity concentration peak arranged on a deeper side may be in a range equal to or higher than 0.6 μm and equal to and lower than 2 μm. Preferably, the value of an impurity concentration peak arranged on a surface side is higher. A plurality of impurity concentration peaks may be arranged.

In a preferable specific example of impurity concentration, the impurity concentration of the P-type semiconductor region 305 is three times or more the P-type impurity concentration of the first part 311. More desirably, it is set to ten times or more. Notably, while the first part 311 having a lower impurity concentration peak value is formed at one position in the depth direction according to this exemplary embodiment, a plurality of first parts 311 may be formed. In such a case, the depth positions of all first parts 311 may be formed more closely to other impurity concentration peak positions than a position where the N-type semiconductor region 203a has a maximum impurity concentration peak value. Providing the first parts 311 in this manner may improve the number of saturation charges in the photoelectric conversion element PD1. Satisfaction of the same condition in the N-type semiconductor region 203b of the photoelectric conversion element PD2 may also improve the number of saturation charges in the photoelectric conversion element PD2. More specifically, a value of impurity concentration may be in a range equal to or higher than $1E16$ $cm^{-3}$ and $6E17$ $cm^{-3}$. A depth of an impurity concentration peak corresponding to the second part 312 formed on a surface may be in a range equal to or higher than 0.1 μm and equal to or lower than 0.4 μm. A depth of an impurity concentration peak corresponding to the second part 312 arranged on a deeper side may be in a range equal to or higher than 0.7 μm and equal to or lower than 3 μm.

Reducing the concentration of the first part 311 may result in unnecessarily easy movement of charges between the PD1 and PD2, making distinctive readout of signals of the PD1 and PD2 difficult. In other words, in a case where signals of a plurality of photoelectric conversion elements included in one photoelectric conversion unit are used to perform a focus detection, detection of a phase difference is difficult, which may reduce accuracy of the focus detection. To prevent such accuracy reduction, the depth where the first part 311 is formed may be arranged at a deeper position than the impurity concentration peaks of the N-type semiconductor regions 203 and 204.

More specifically, the first part 311 may be formed at a deeper position than the deepest part of the potential for signal charges formed by the N-type semiconductor regions 203 and 204.

The P-type impurity concentration of the first part 311 may be $2\times10^{15}$ $cm^{-3}$ or lower. More preferably, it may be in a range equal to or higher than $1E15$ $cm^{-3}$ and equal to or lower than $4E15$ $cm^{-3}$. A depth of an impurity concentration peak corresponding to the first part 311 may be in a range equal to or higher than 0.6 μm and equal to or lower than 2 μm.

Because the N-type semiconductor regions 203 and 204 are deleted by the second part 312, the numbers of saturation charges of the PD1 and PD2 may be maintained at an equal level to a case where the first part 311 is replaced by the second part 312.

Figure 4B:
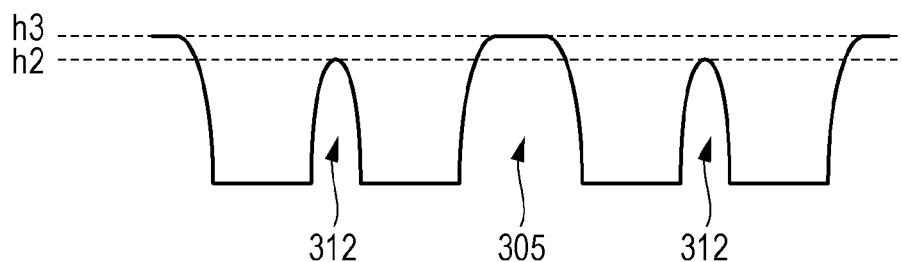
Figure 4C:
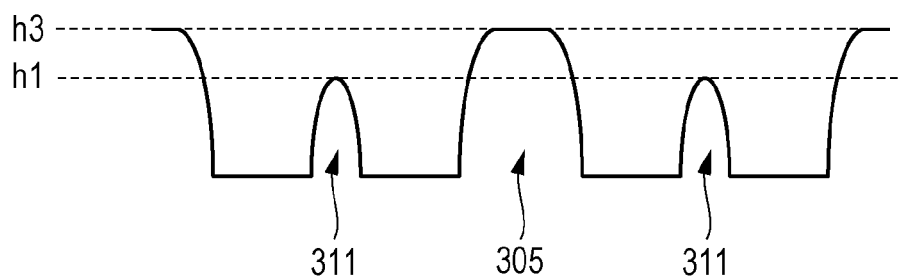

FIG. 4B illustrates a section view of the potential profile taken at the broken line IVB-IVB in FIG. 4A, and FIG. 4C illustrates a section view of the potential profile taken at the broken line IVC-IVC in FIG. 4A.

As illustrated in FIGS. 4B and 4C, the potential barrier generated by the first part 311 has a height h1 and the potential barrier generated by the second part 312 has a height h2 in the potential barriers between the PD1 and PD2 included in the first photoelectric conversion unit. A potential barrier 305 between the PD2 and PD3 included in a different photoelectric conversion unit and being adjacent to each other has a height h3. The height h1 of the potential barrier between the PD1 and the PD2 formed by the first part 311 may be lower than the height h2 of the potential barrier between the PD1 and PD2 formed by the second part 312 and may be lower than the height h3 of the potential barrier between the PD2 and the PD3. The height h2 of the potential barrier between the PD1 and PD2 and the height h3 of the potential barrier between the PD2 and PD3 generated by the second part 312 may be approximately equal, or the height h2 may be lower than height h3.

Adopting this structure may cause a signal after addition of signals of photoelectric conversion elements included in the first photoelectric conversion unit to have a linearity according to an incident light quantity.

This exemplary embodiment is applicable to various photoelectric conversion elements and it is particularly suitable for a case where there is a difference in sensitivity, amount of saturation or incident light quantity in a plurality of photoelectric conversion elements whose outputs are added to each other. The difference in incident light quantity here refers to a difference in quantity of light that actually enters to photoelectric conversion elements when light enters evenly to the entire photoelectric conversion apparatus, for example. Particularly, such a difference may easily occur when light condensed by one micro lens enters to a plurality of photoelectric conversion element disposed at planarly different positions.

Next, an example of impurity concentration of a P-type semiconductor region will be described. The P-type impurity concentration of the P-type semiconductor region 305 forming the potential barrier 305 may be set three times or more the P-type impurity concentration of the P-type semiconductor region 311 that forms the potential barrier 311. Setting three times or more may produce a difference in potential barrier approximately equal to that formed with the potential (approximately 26 mV at a room temperature of 27° C.) of charges. Further desirably, ten times or more may be set in consideration of the operating temperature range of the photoelectric conversion apparatus.

Figure 5:
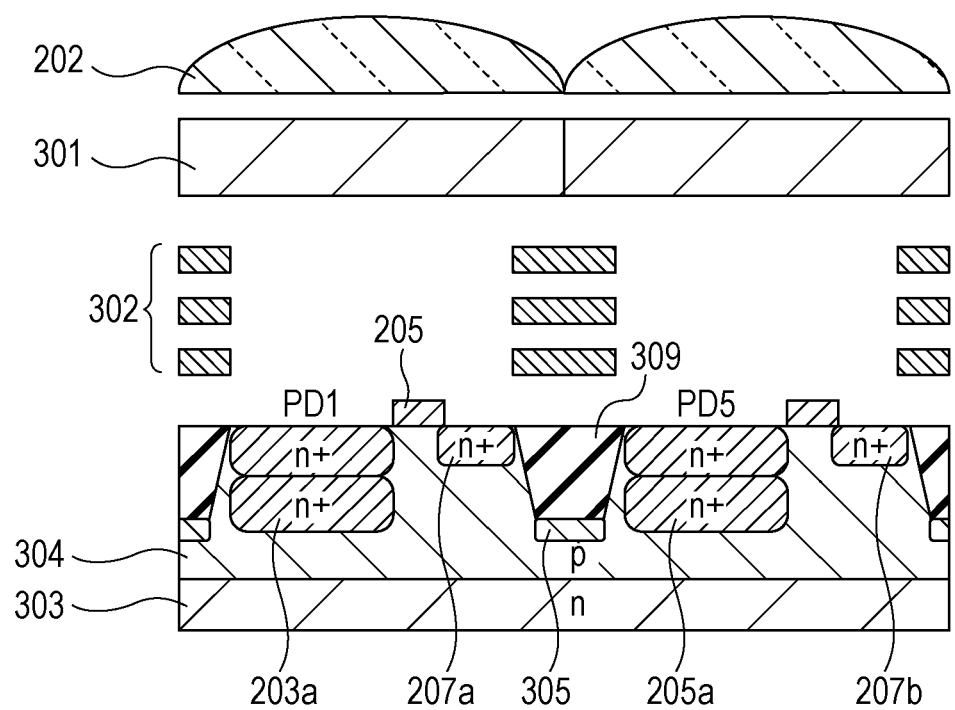
FIG. 5 schematically illustrates a section structure of the photoelectric conversion apparatus according to the first exemplary embodiment.

Next, a configuration in FIG. 5 will be described. FIG. 5 is a section view taken at line V-V in FIG. 3. FIG. 5 illustrates a first photoelectric conversion unit and photoelectric conversion elements in a third photoelectric conversion unit adjacent to the first photoelectric conversion unit in the lower part of the drawing. Dielectric isolation 309 containing an insulating material is provided between the floating diffusion region 207 of the first photoelectric conversion unit and a photoelectric conversion element PD5 included in the second photoelectric conversion unit. The dielectric isolation 309 may be implemented by a publicly known method or structure such as LOCOS (LOCal Oxidation of Silicon) and STI (Shallow Tranch Isolation). With respect to the heights of the potential barriers, not shown, the height of a potential barrier generated by the dielectric isolation 309 is higher than the height of a potential barrier generated by the P-type semiconductor region 312. The height of a potential barrier generated by the dielectric isolation 309 and the height of a potential barrier generated by the P-type semiconductor region 305 are arbitrary and may be set properly on the basis of the layout of elements, for example. In this case, dielectric isolation is disposed between a floating diffusion region and a photoelectric conversion element, for example. Alternatively, dielectric isolation may be provided between a transistor of a pixel unit and a photoelectric conversion element.

Figure 6:
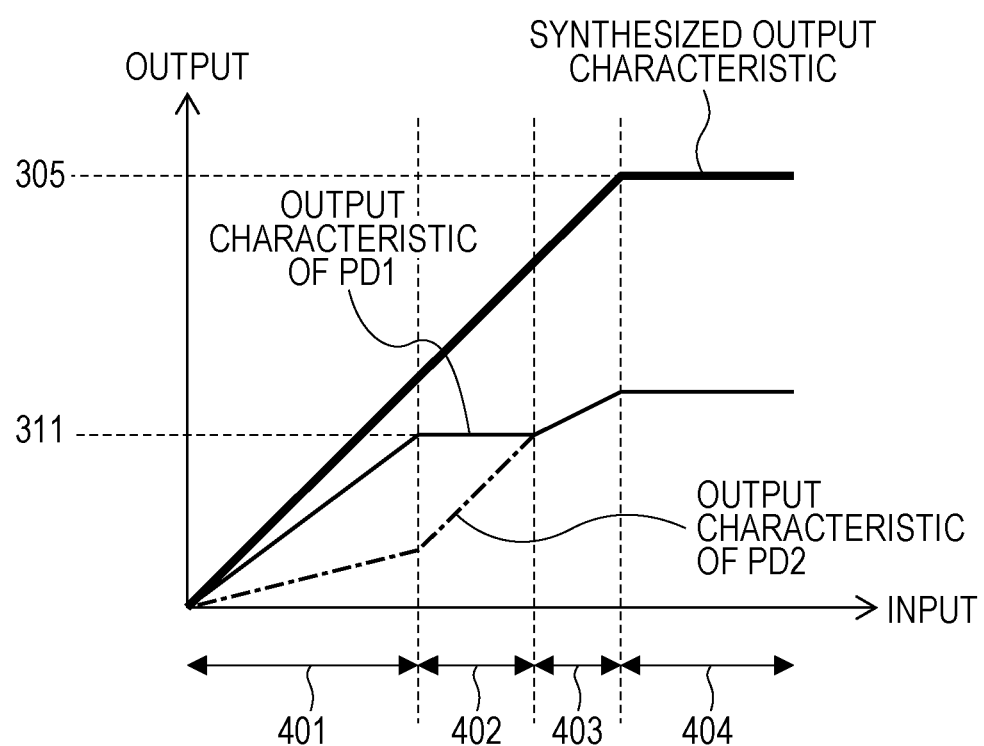
FIG. 6 schematically illustrates an output of the photoelectric conversion apparatus according to the first exemplary embodiment.
Figure 15:
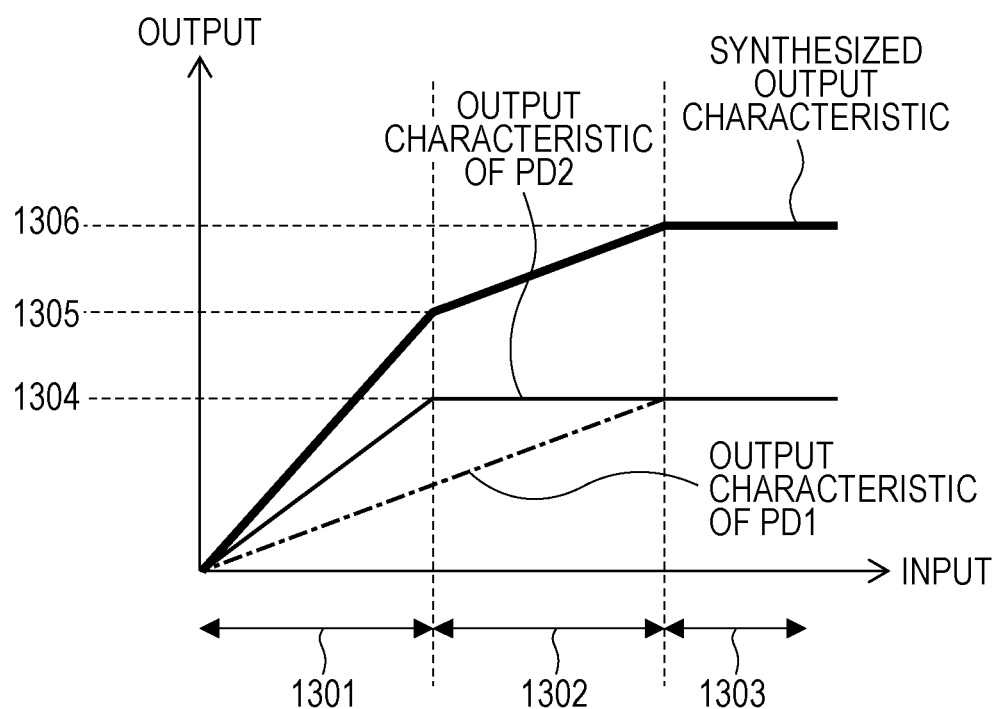
FIG. 15 is an explanatory diagram schematically illustrating an output of a photoelectric conversion apparatus according to a comparison example.

With reference to FIGS. 6 and 7A to 7D, outputs of PDs and a synthesized output after addition of them will be described. FIG. 6 illustrates input/output characteristics of the two PD1 and PD2 and a synthesized input/output characteristic in a case where outputs of the PD1 and PD2 are synthesized. The horizontal axis represents incident light quantity, and the vertical axis represents output from a photoelectric conversion element. As a comparison example, FIG. 15 illustrates a synthesized output of a photoelectric conversion apparatus having a different impurity concentration profile from that of this exemplary embodiment.

Figure 7A:
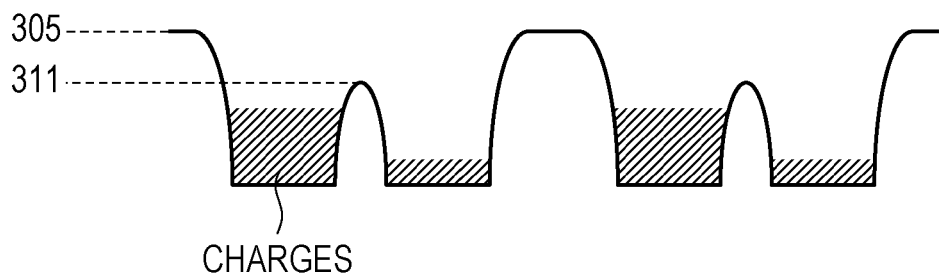
FIGS. 7A to 7D schematically illustrate states that charges are being accumulated in the photoelectric conversion apparatus according to the first exemplary embodiment.
Figure 7B:
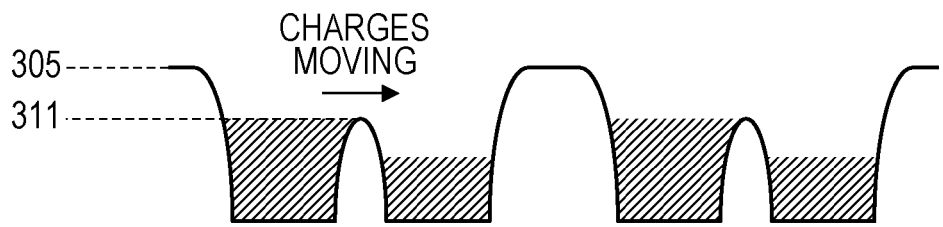

FIGS. 7A to 7D schematically illustrate the potential profile in FIG. 4C and generated electrons. For convenience of description, FIGS. 6 and 7A to 7D assume a case where the PD1 has a higher sensitivity or a larger incident light quantity than the PD2. When the incident light quantity to the photoelectric conversion element is within the range 401, the PD1 generates a larger amount of electrons than that generated by the PD2. Such a state is illustrated in FIG. 7A. The synthesized output of the PD1 and the PD2 has a proper value. The next range 402 is produced when the PD1 is saturated and the PD2 is not saturated. In this case, as illustrated in FIG. 7B, the electrons generated by the PD1 may possibly get over the potential barrier 311 and move to the PD2. Thus, in the range 402, the output of the PD2 is based on the amount of electric charges caused by synthesis of a part of the electrons generated by the PD2 and a part of the electrons generated by the PD1. Thus, the height h1 of the potential barrier 311 is produced lower than the height h3 of the potential barrier 305. This structure allows a part of electrons generated by the PD1 to move to the PD2. Even with the incident light quantity in the range 402, the synthesized output of the PD1 and PD2 may have linearity.

Figure 7C:
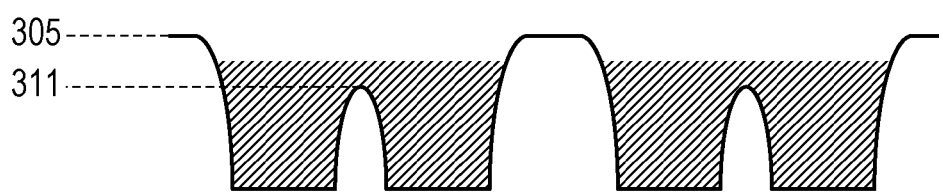

In the range 403, as illustrated in FIG. 7C, both of the PDs 1 and 2 have a saturation level defined by the potential barrier 305 beyond the saturation level defined by the potential barrier 311.

Figure 7D:
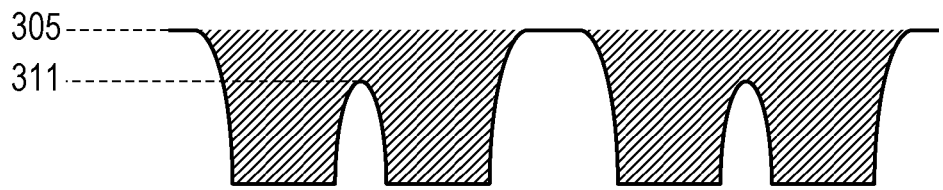

In the range 404, as illustrated in FIG. 7D, because both of the PDs 1 and 2 reach the saturation level defined by the potential barrier 305, and the synthesized output may also saturate.

On the other hand, FIG. 15 illustrates an example in which the height of a potential barrier between photoelectric conversion elements included in a same photoelectric conversion unit is equal to the height of a potential barrier between adjacent photoelectric conversion elements included in different photoelectric conversion units from each other. FIG. 15 illustrates input/output characteristics of the PDs 1 and 2 that are two photoelectric conversion elements included in the first photoelectric conversion unit and a synthesized input/output characteristic acquired when outputs of the PD1 and PD2 are synthesized. The synthesized output may be acquired by adding signals of at least photoelectric conversion elements. In order to acquire such a synthesized output, averaging, amplification and so on maybe performed.

For convenience of explanation, FIG. 15 illustrates an assumed state that the PD2 has a higher sensitivity than the PD1 or receives a larger quantity of light. When the incident light onto the photoelectric conversion element is in the range 1301, more charges occur in the PD2 than in the PD1. Because the PD2 is not saturated, synthesis of outputs of the PD1 and PD2 results in a proper output. However, when the PD2 is saturated but the PD1 is not saturated, the PD1 only outputs a signal having linearity according to incident light. Thus, the synthesized output depends on the output of the PD1 after the PD2 is saturated. As a result, the synthesized output has a knee characteristic after the PD2 is saturated. This phenomenon becomes significant when charges occurring after the PD2 is saturated leak out of the PD1. Due to this phenomenon, a desirable synthesized signal may not be acquired in some cases.

According to this exemplary embodiment, the height of a potential barrier between photoelectric conversion elements included in a same photoelectric conversion unit is lower than the height of a potential barrier between adjacent photoelectric conversion elements included in different photoelectric conversion units from each other. This configuration may improve the linearity.

Second Exemplary Embodiment

A second exemplary embodiment will be described with reference to drawings. FIGS. 8A to 8C are a top view and section views of a photoelectric conversion unit according to this exemplary embodiment.

Referring to FIG. 8A, a P-type semiconductor region disposed between a PD1 and a PD2 included in a first photoelectric conversion unit includes a first part 701 and second parts 702 and 703 having a higher P-type impurity concentration than the first part 701.

This exemplary embodiment is different from the first exemplary embodiment in that the first part 701 and the second part 702 are disposed at different positions from each other in planar view.

Figure 9A:
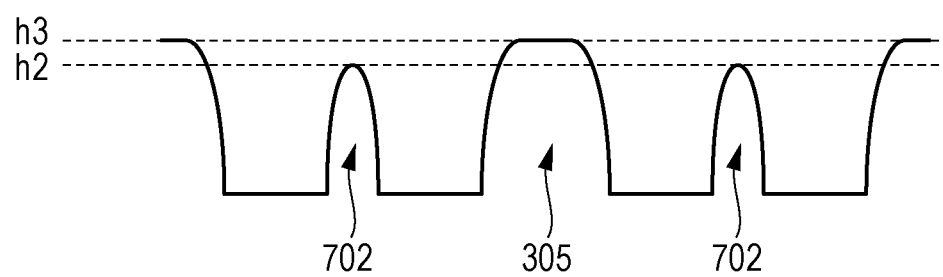
FIGS. 9A and 9B schematically illustrate potential profiles of the photoelectric conversion apparatus according to the second exemplary embodiment.

The P-type impurity concentration of the first part 701 is lower than the P-type impurity concentration of the P-type semiconductor region 305. FIG. 8B illustrates a section structure taken at the broken line VIIIB-VIIIB in FIG. 8A, and FIG. 8C illustrates a section structure taken at the broken line VIIIC-VIIIC in FIG. 8A. FIG. 9A illustrates a potential profile taken at the broken line IXA-IXA in FIG. 8A, and FIG. 9B illustrates a potential structure taken at the broken line IXB-IXB in FIG. 8A.

The height of an impurity concentration peak formed correspondingly to the second part 702 is lower than the height of an impurity concentration peak arranged correspondingly to the first part 701. The height of a potential barrier formed correspondingly to the second part 702 is lower than the height of a potential barrier formed correspondingly to the first part 701.

Figure 9B:
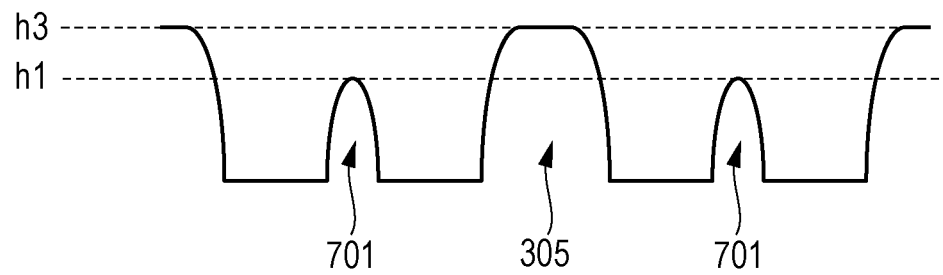

FIGS. 9A and 9B illustrate potential profile formed by the structure. The potential barrier configured by the first part 701 is lower than the potential barrier configured by the second part 702.

As a preferable example of the impurity concentration, the P-type impurity concentration of the P-type semiconductor region 305 is set three times or more the P-type impurity concentration of the first part 701. Desirably, ten times or more is set.

Here, the first part 701 may easily change in its potential state in accordance with the amount of electrons present in the N-type semiconductor regions 203a and 203b. Thus, the probability that charges occurring in the first part 701 move to the PD1 or PD2 may vary between a state immediately after start of accumulation in the PD1 and PD2 and a state one PD such as the PD1 has more charges than the PD2. For example, many charges exist in the PD1 immediately after start of accumulation therein, Coulomb interactions of the charges present within the PD1 may change the potential of the first part 701. After that, the probability that the charges occurring in the first part 701 move to the PD2 increases. In other words, the probability that charges move to the PD1 and PD2 changes. In this configuration, for example, a feedback may apply that cancels a signal difference between the PD for detecting a phase difference, which may deteriorate the accuracy of focus detection.

Such deterioration of accuracy may be suppressed by some arrangement of the first part 701 as will be described below.

More specifically, in planar view, the first part 701 may be disposed offset from a projection position to a light-receiving surface of a photoelectric conversion element at a center position of a micro lens. In FIG. 8A, the line IXA-IXA is a line segment crossing a substantial center of the micro lens. In the drawing, with respect to the line segment, the first part 701 is disposed offset in the upper direction in planar view. Essentially, the first part 701 is disposed apart from a vicinity of a position where the intensity of light condensed by the micro lens reaches a peak. For example, in FIGS. 8A to 8C, the first part 701 is disposed offset in the upper direction, but, without limiting to it, it may be disposed offset in a lower direction or, in some cases, in the right and left direction. Desirably, the first part 701 may be disposed offset by 0.1 µm or more from the center of the micro lens. More desirably, it may be disposed offset by 0.2 µm or more. This is provided for a case where the range of a wavelength handled by the PD is a what is called visual light range. It is an example of a case where the wavelength of visible light is approximately 0.4 to 0.8 µm, and the focal point of a micro lens exists in a photoelectric conversion element. Because the condensed state in a photoelectric conversion element also depends on the F-number of an objective lens, a larger offset amount may be adopted when a photoelectric conversion apparatus according to this exemplary embodiment is applied to an optical system with a low F-number. For example, in a system in which the F-number of an objective lens therein may be set to 2.0, light tilted by 14 degree at a maximum from a perpendicular enters to a micro lens. When the distance between the micro lens and the PD is 2 µm, the position of the focal point of incident light tilted by 14 degree is disposed offset by 0.5 µm in at least one direction from the position where the center position of the micro lens is projected to the light-receiving surface. In this case, it is particularly effective that the first part 701 is disposed offset by 0.5 µm or more from the center position of the micro lens. The upper limit of the offset amount is the half of a pitch between adjacent photoelectric conversion elements.

Third Exemplary Embodiment

Figure 10A:
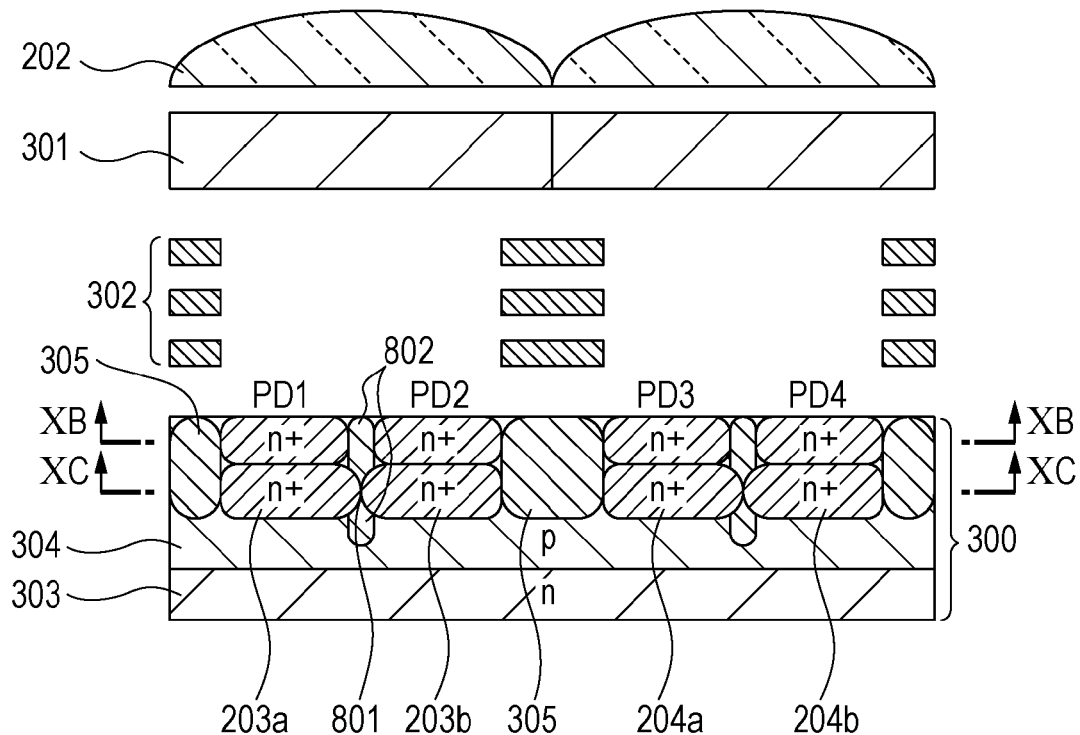
FIGS. 10A to 10C schematically illustrate a section structure and potential profiles of a photoelectric conversion apparatus according to a third exemplary embodiment.
Figure 10B:
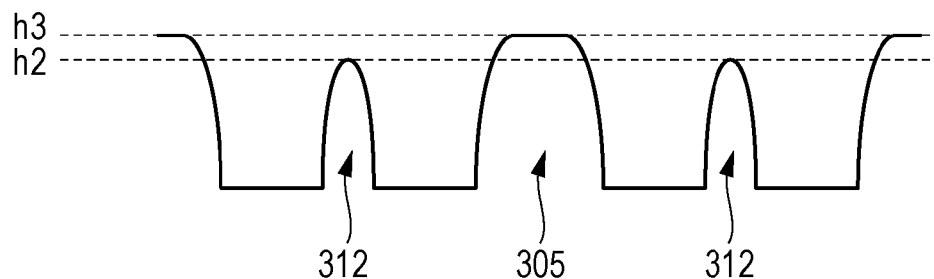
Figure 10C:
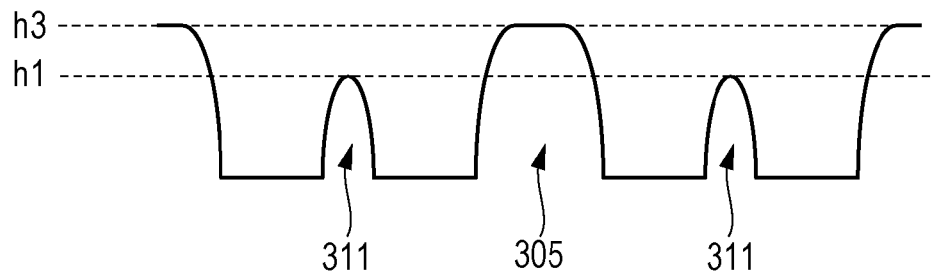

A third exemplary embodiment will be described with reference to drawings. FIGS. 10A to 10C are section views of a photoelectric conversion unit according to this exemplary embodiment. Like numbers refer to like parts having similar functions to those of the first and second exemplary embodiments, and detail description will be omitted.

This exemplary embodiment is different from the first and second exemplary embodiments in that a P-type semiconductor region disposed between the N-type semiconductor regions 203a and 203b has a first part 801 and a second part 802 and that the width of the first part 801 is narrower than the width of the second part 802.

FIG. 10B illustrates a cross-section potential profile taken at the line XB-XB in FIG. 10A, and FIG. 10C illustrates a cross-section potential profile taken at the broken line XC-XC in FIG. 10A. This configuration may also provide the same effects as those of the aforementioned exemplary embodiments.

While the first part 801 and the second part 802 are arranged at different depths in FIG. 10A, they may be arranged at an equal depth but at different positions in planar view as in the second exemplary embodiment. The first part 801 may include a plurality of parts that are apart from each other.

Fourth Exemplary Embodiment

Figure 11A:
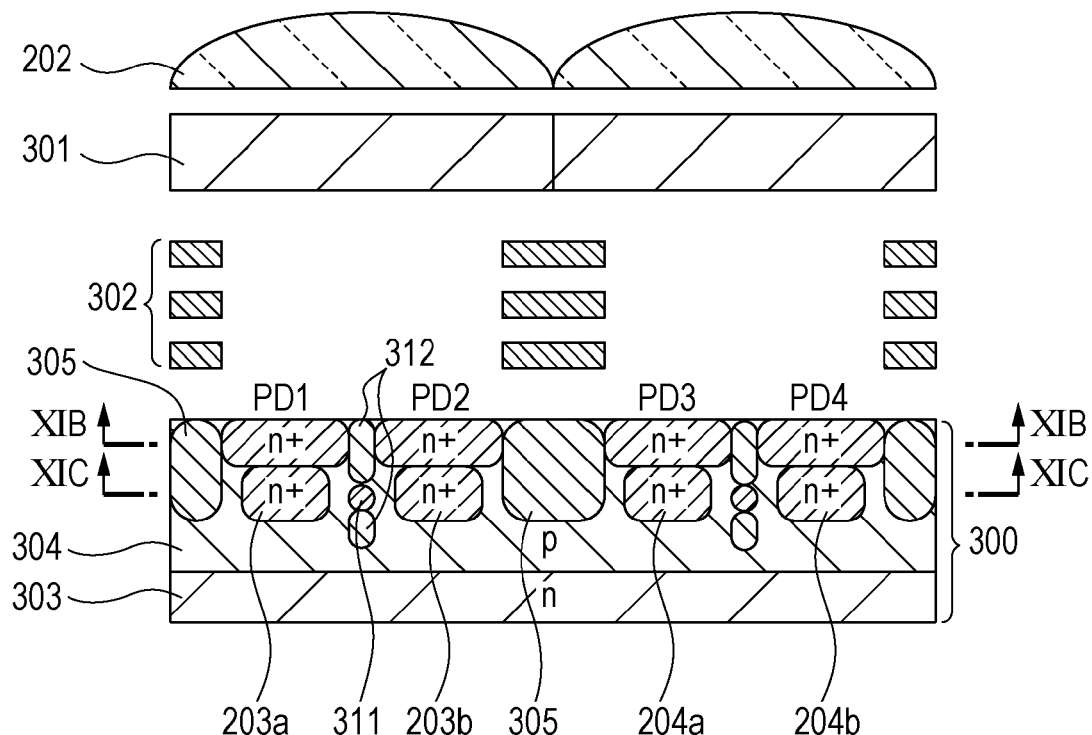
FIGS. 11A to 11C schematically illustrate a section structure and potential profiles of a photoelectric conversion apparatus according to a fourth exemplary embodiment.
Figure 11B:
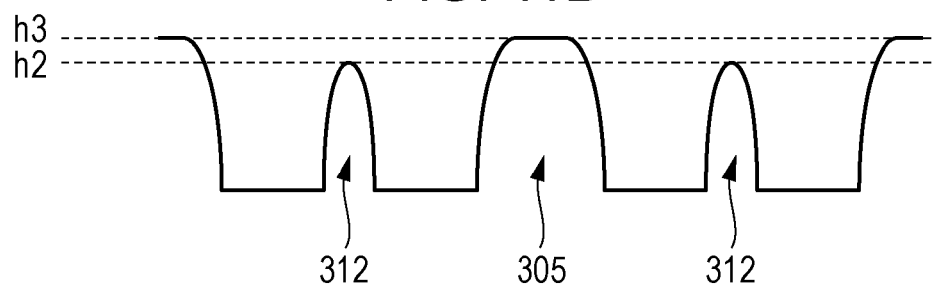
Figure 11C:
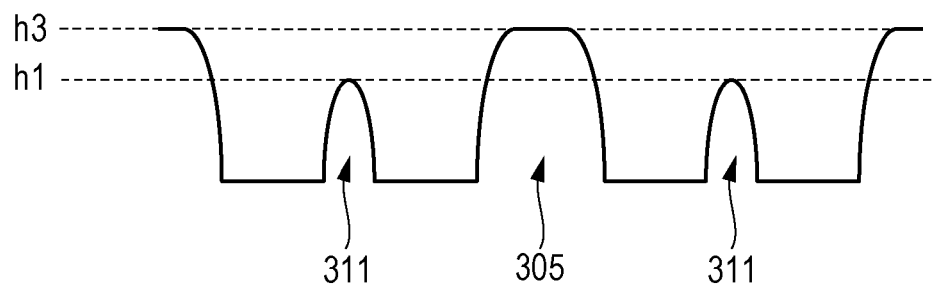

A fourth exemplary embodiment will be described with reference to drawings. FIGS. 11A to 11C are section views of a photoelectric conversion unit according to this exemplary embodiment. Like numbers refer to like parts having similar functions to those of the first and second exemplary embodiments, and detail description will be omitted. This exemplary embodiment is different for the first to third exemplary embodiments in that the N-type semiconductor regions 203a and 203b have different areas in a depth direction.

FIG. 11B illustrates a cross-section potential profile taken at the line XIB-XIB in FIG. 11A, and FIG. 11C illustrates a cross-section potential profile taken at the broken line XIC-XIC in FIG. 11A. This configuration may also provide the same effects as those of the aforementioned exemplary embodiments.

Application to Focus Detection Apparatus

The photoelectric conversion apparatus according to any one of the aforementioned exemplary embodiments is applicable as an apparatus configured to perform a focus detection on an imaging apparatus and image sensing surface. More specifically, an example will be described in which a focus for imaging is detected with phase difference detection on an image sensing surface.

Figure 12:
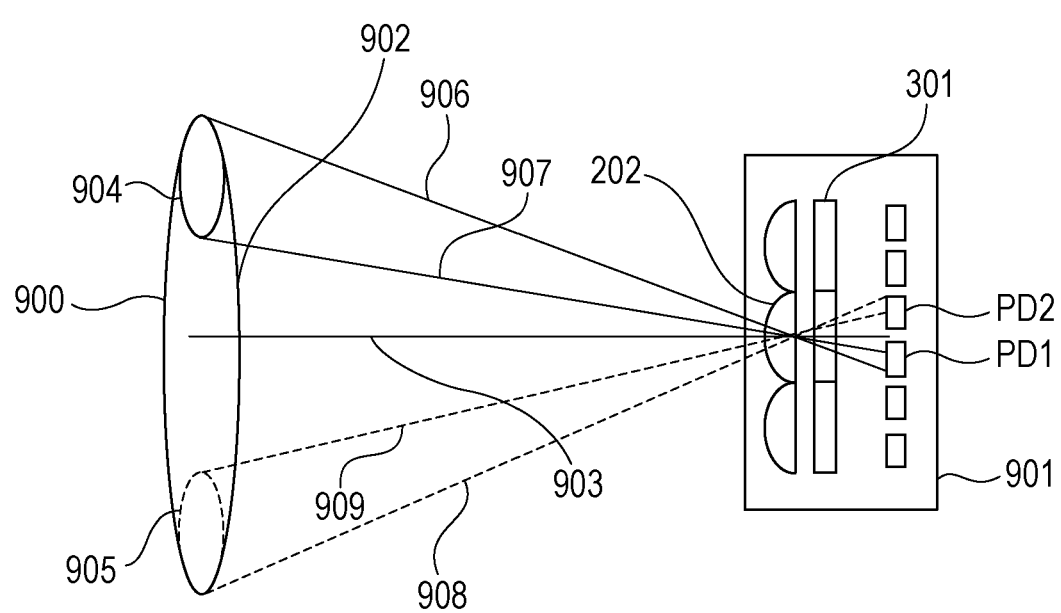
FIG. 12 schematically illustrates a focusing relationship with an object.
Figure 13A:
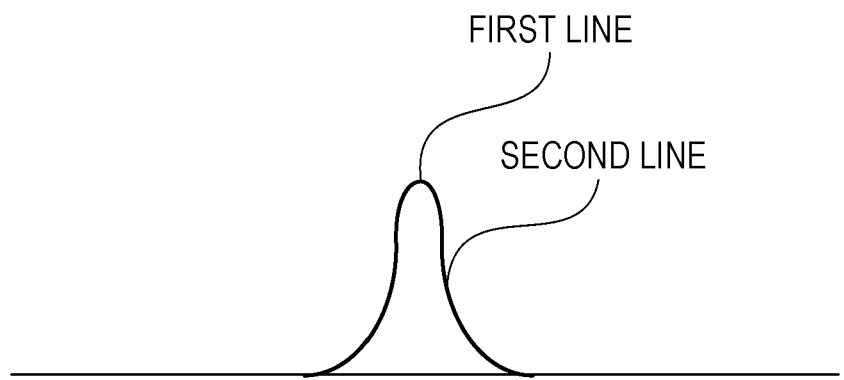
FIGS. 13A and 13B schematically illustrate a phase difference focus detection.
Figure 13B:
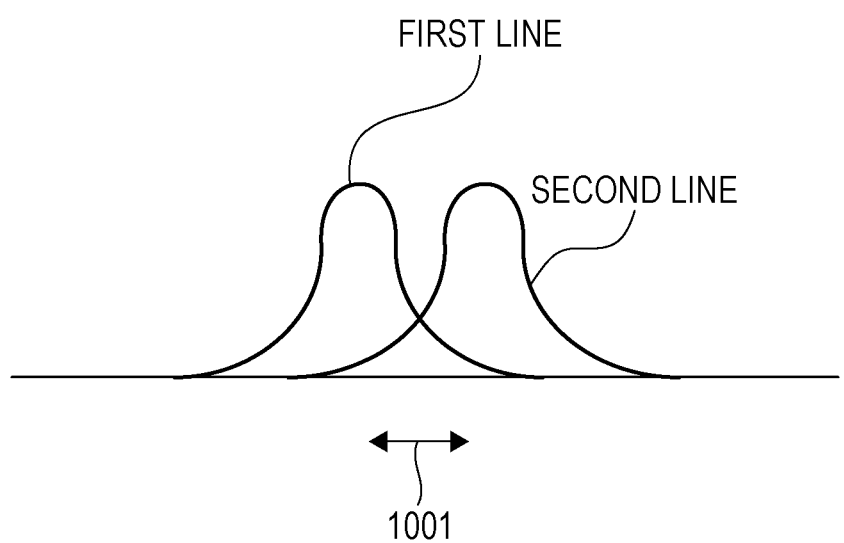

The example will be described with reference to FIG. 12 and FIGS. 13A and 13B. FIG. 12 is a conceptual diagram illustrating that a light beam emitted from an exit pupil of a photographing lens 900 enters to an imaging apparatus 901. A micro lens 202 and a color filter 301 are provided. Photoelectric conversion elements PD1 and PD2 are a plurality of photoelectric conversion elements to which light condensed by the one micro lens. The photographing lens 900 has an exit pupil 902. It is assumed here that the center of a light beam ejected from the exit pupil 902 to a photoelectric conversion unit of the micro lens 202 is an optical axis 903. Light ejected from the exit pupil enters to the imaging apparatus 901 with the optical axis 903 as its center. Outermost light beams 906 and 907 pass through a partial region 904 of the exit pupil. Outermost light beams 908 and 909 pass through a partial region 905 of the exit pupil 902. As seen from FIG. 11A, about the optical axis 903 of light beams ejected from the exit pupil 902, an upper light beam enters to the PD1, and a lower light beam enters to the PD2. In other words. The PD1 and PD2 receive light from different regions of the exit pupil of the photographing lens.

By using this characteristic, a phase difference may be detected. Here, data acquired from one PD will be called a first line and data acquired from the other PD will be called a second line among a plurality of photoelectric conversion elements to which light condensed by one micro lens enters when imaging regions are viewed from the above in a region within pixels. By acquiring correlation data between the lines, a phase difference may be detected.

For example, it is assumed in FIG. 12 that data of a PD disposed on a lower side is a first line and data of a PD disposed on an upper side is a second line among photoelectric conversion elements to which light condensed by one micro lens enters. In this case, the PD1 outputs data of the first line for one pixel, and the PD2 outputs data of the second line for one pixel. FIGS. 13A and 13B illustrate line data when a point source is focused. FIG. 13A illustrates data of the first line and the second line in focus. The horizontal axis represents pixel position, and the vertical axis represents output. The first line and the second line overlap in focus. FIG. 13B illustrates line data out of focus. In this case, a phase difference occurs between the first line and the second line, and the pixel positions are misaligned. By calculating a misalignment amount 1001 thereof, the difference from the state in focus may be acquired. The focus may be adjusted by detecting the phase different in that manner and driving the lens.

Next, image data generation in the pixel arrangement will be described. As described above, focusing may be detected by reading signals of the PD1 and PD2 separately from the imaging apparatus 901 and performing an operation for detecting a phase difference. The signals of the PDs to which light condensed by one micro lens enters may be added to generate a photographed image.

However, when one PD is saturated, that is, in states in the ranges 401, 402, and 403 in FIG. 6, the signals of the PDs are different from the outputs acquired by the PDs separately. Thus, in some cases, the signals of the PDs may be determined as having low reliability. In such a case, a sequence may be adopted which does not perform phase detection or stops phase detection. In other words, phase difference detection is to be performed on an image surface of an imaging apparatus or not may be determined to operate the apparatus in accordance with the signals of the PDs or charges that may be accumulated.

Having described pixels near the center of the imaging element with reference to FIG. 12, pixels for detecting focus may be disposed in an end portion rather than a center part of an imaging region for higher accuracy because pixels in a peripheral region of an imaging element have significantly different in incident light quantity between PDs.

Application to Imaging System

Figure 14:
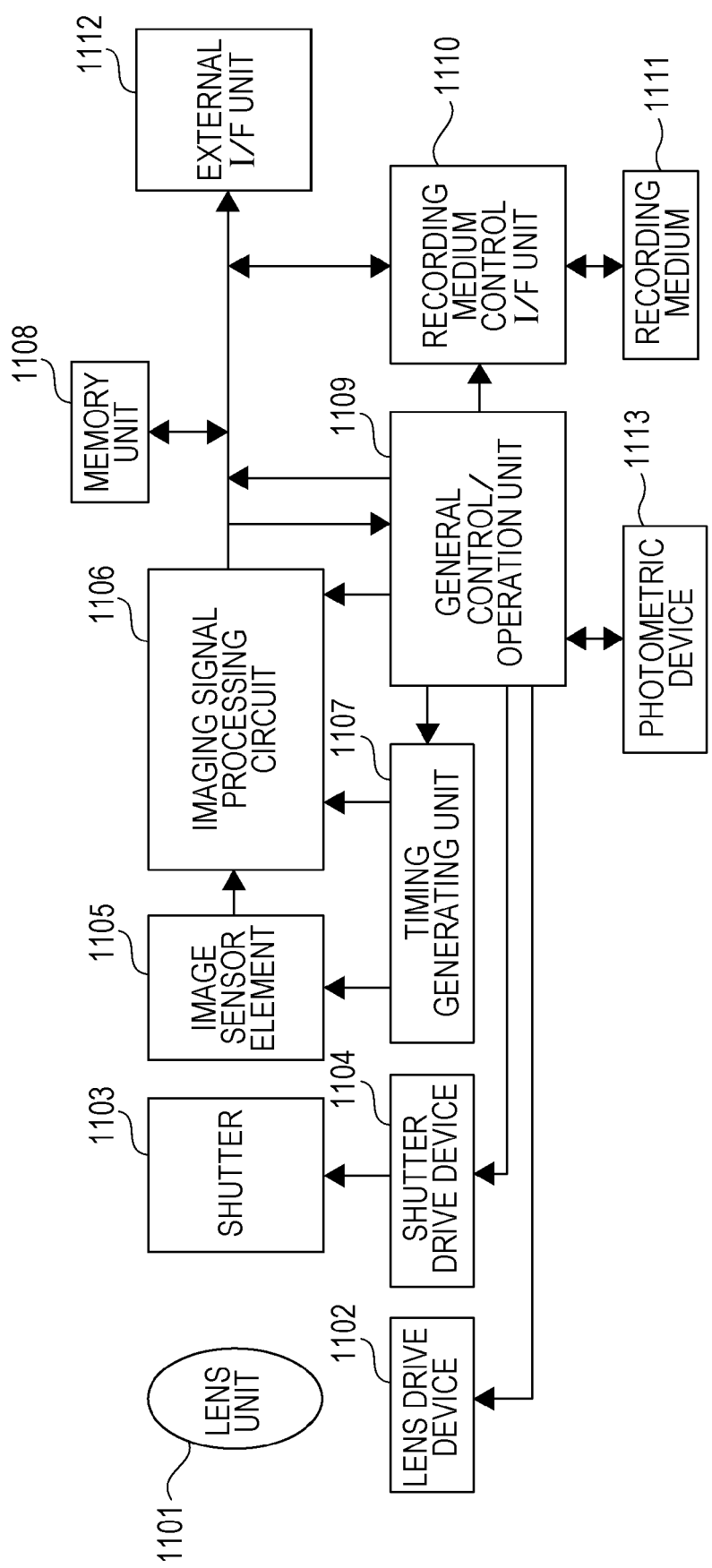
FIG. 14 illustrates a block diagram of an imaging system according to one embodiment.

FIG. 14 illustrates an example of an imaging system to which an imaging apparatus of any one of the aforementioned exemplary embodiments are applicable.

FIG. 14 illustrates a lens unit 1101 configured to focus an optical image of an object to an imaging apparatus 1105, and a lens drive device 1102 may perform zooming control, focusing control, diaphragm control and so on. A mechanical shutter 1103 is controlled by a shutter control device 1104. The imaging apparatus 1105 is configured to capture an object focused by the lens unit 1101 as an image signal. An imaging signal processing circuit 1106 may be configured to perform a correction and data compression on an image signal output from the imaging apparatus 1105. A timing generating unit 1107 is a driving unit configured to output timing signals to the imaging apparatus 1105 and the imaging signal processing circuit 1106. A control circuit 1109 generally controls an operation and the imaging apparatus. A memory 1108 temporarily stores image data. A recording medium control I/F unit 1110 is an interface usable for recording to or reading from a recording medium. A detachable recording medium 1111 is configured to record or read image data such as a semiconductor memory. An external I/F unit 1112 may be a display unit configured to display information or a captured image.

Next, operations of a digital camera for photographing in the configuration above will be described.

When a main power supply is turned on, a power supply for a control system is turned on, and a power supply for an image-related circuit such as the imaging signal processing circuit 1106 is turned on.

When a release button (not shown) is pressed, a focusing operation is performed on the basis of data from the imaging apparatus 1105. The control circuit 1109 calculates a distance to an object on the basis of a focusing result. After that, the lens drive device 1102 drives the lens unit and determines whether it is in focus or not. If it is determined that it is not in focus, the lens unit is driven again for focusing. This focusing operation may be performed by an apparatus specific to focusing (not illustrated) instead of by using data from imaging elements.

After the focusing is recognized, a photographing operation starts. After the photographing operation ends, an image signal output from the solid-state imaging element 1105 is image-processed by the imaging signal processing circuit 1106, and the control circuit 1109 writes it in memory 1108. The imaging signal processing circuit may perform a sorting process, an addition process, a selection process, and so on. The data accumulated in the memory 1108 passes through the recording medium control I/F unit 1110 and is recorded in the detachable recording medium 1111 such as a semiconductor memory under control of the control circuit 1109.

The data may pass through an external I/F unit (not illustrated) and be directly input to a computer, for example, for performing image processing thereon.

The specific exemplary embodiments and application examples have been described. The disclosure is not limited by the embodiments, but various changes and modifications are possible without departing from the spirit and scope of the disclosure. The disclosure is applicable to various photoelectric conversion elements and may effectively be applicable to a configuration having a sensitivity difference or a difference in quantity of incident light between photoelectric conversion elements. For example, according to any one of the exemplary embodiments, an example has been described in which pixels are used for focal point detection for an objective lens according to the disclosure. However, an imaging apparatus of the disclosure is characterized by maintenance of linearity of an output when signals of a plurality of photoelectric conversion elements are added for reading and is also applicable to other than focal point detection. For example, a plurality of photoelectric conversion elements may be two different types of band pass color filters. More specifically, R', G', and B' color filters for different band passes may be mounted for RGB colors. When they are read individually, signals of six colors may be acquired, which may improve color reproducibility. On the other hand, performing an operation of adding outputs of PDs to acquire signals of three colors R+R', G+G', and B+B' may result in higher sensitivity and improve the S/N ratio. The disclosure is also applicable to a configuration allowing switching one imaging apparatus between those two photographing modes.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-080805, filed Apr. 8, 2013, which is hereby incorporated by reference herein in its entirety.

What is claimed is:

1. A photoelectric conversion apparatus having a plurality of photoelectric conversion units, each including a plurality of photoelectric conversion elements, the apparatus comprising:
a first semiconductor region of a first conductivity type configured to collect signal charges in each of the plurality of photoelectric conversion elements; and
a second semiconductor region of a second conductivity type between the first semiconductor regions of the photoelectric conversion elements that are included in a photoelectric conversion unit and are disposed adjacent to each other, wherein
the first semiconductor region has a plurality of impurity concentration peaks arranged at different depths from each other; and
the second semiconductor region has a plurality of impurity concentration peaks arranged at different depths from each other; wherein
the plurality of impurity concentration peaks in the first semiconductor region include
a first impurity concentration peak;
a second impurity concentration peak having a lower impurity concentration than that the first impurity concentration peak has; and
the plurality of impurity concentration peaks in the second semiconductor region include
a third impurity concentration peak;
a fourth impurity concentration peak having a higher impurity concentration than that the third impurity concentration peak has, and arranged on a surface side of the third impurity concentration peak; and
a fifth impurity concentration peak having a higher impurity concentration than that the third impurity concentration peak has, and arranged on a deeper side of the third impurity concentration peak; wherein
a difference between the depth where the third impurity concentration peak is arranged and the depth where the second impurity concentration peak is arranged is smaller than a difference between the depth where the third impurity concentration peak is arranged and the depth where the first impurity concentration peak is arranged.

2. The photoelectric conversion apparatus according to claim 1, further comprising a third semiconductor region of the second conductivity type between the first semiconductor regions of the photoelectric conversion elements disposed adjacent to each other of the plurality of photoelectric conversion element included in different photoelectric conversion units disposed adjacent to each other,
wherein an impurity concentration of the second conductivity type of at least a partial region of the second semiconductor region is lower than an impurity concentration of the second conductivity type of the third semiconductor region.

3. The photoelectric conversion apparatus according to claim 1, wherein each of the photoelectric conversion units includes a plurality of photoelectric conversion elements to which light condensed by one micro lens enters.

4. The photoelectric conversion apparatus according to claim 2, wherein an impurity concentration of the third semiconductor region is three times or more the impurity concentration of the first impurity concentration peak.

5. The photoelectric conversion apparatus according to claim 3, wherein an impurity concentration of the third semiconductor region is ten times or more the impurity concentration of the third impurity concentration peak.

6. The photoelectric conversion apparatus according to claim 1, wherein a width in planer view of a region corresponding to the third impurity concentration peak is narrower than a width in planer view of a region corresponding to the fourth impurity concentration peak.

7. The photoelectric conversion apparatus according to claim 6, wherein a region corresponding to the third impurity concentration peak is arranged at a position geometrically different from a region corresponding to the fourth impurity concentration peak in the second semiconductor region in planar view.

8. The photoelectric conversion apparatus according to claim 1, wherein the depth of the third impurity concentration peak is different from the depth of an impurity concentration peak of the first semiconductor region.

9. The photoelectric conversion apparatus according to claim 1, wherein a region corresponding to the second impurity concentration peak is larger in area in planer view than a region corresponding to the first impurity concentration peak in the first semiconductor region in planar view.

10. The photoelectric conversion apparatus according to claim 7, wherein each of the photoelectric conversion units includes a plurality of photoelectric conversion elements to which light condensed by one micro lens enters; and
a region corresponding to the third impurity concentration peak
is disposed offset in at least one direction from a projection position to a light-receiving surface at a center position of the micro lens.

11. The photoelectric conversion apparatus according to claim 10, wherein an amount of the offset is equal to or larger than 0.1 µm.

12. The photoelectric conversion apparatus according to claim 1, wherein the plurality of photoelectric conversion elements are disposed at different positions from each other in planar view.

13. A photoelectric conversion apparatus having a plurality of photoelectric conversion units, each including a plurality of photoelectric conversion elements, the apparatus comprising:
a first semiconductor region of a first conductivity type configured to collect signal charges in each of the plurality of photoelectric conversion elements; and a second semiconductor region of a second conductivity type between the first semiconductor regions of the photoelectric conversion elements that are included in the photoelectric conversion units and are disposed adjacent to each other, wherein the first semiconductor region has a first region and a second region positioned at different depths from each other, the first region being configured so that a first potential barrier for signal charges in the first region is formed, the second region being configured so that a second potential barrier for signal charges in the second region that is lower than the first potential barrier is formed;

the second semiconductor region has a third region, a fourth region, and a fifth region positioned at different depths from each other, the third region having a third potential barrier for signal charges, the fourth region having a fourth potential barrier that is higher than the third potential barrier for signal charges, the fifth region having a fifth potential barrier that is higher than the third potential barrier for signal charges;

the third region is formed at a depth between the fourth region and the fifth region; and a difference between the depth where the third region is formed and the depth where the second region is formed is smaller than a difference between the depth where the third region is formed and the depth where the first region is formed.

14. The photoelectric conversion apparatus according to claim 13, further comprising a third semiconductor region of the second conductivity type between the first semiconductor regions of the photoelectric conversion elements disposed adjacent to each other of a plurality of photoelectric conversion elements included in different photoelectric conversion units disposed adjacent to each other, wherein a height of a potential barrier for signal charges of the third region is lower than a height of a potential barrier for signal charges of the third semiconductor region.

15. The photoelectric conversion apparatus according to claim 13, wherein a separation structure of an insulating material is not provided in a region between the first semiconductor regions of the photoelectric conversion element included in the same photoelectric conversion unit and disposed adjacent to each other; and an insulating material is provided in a region between the first semiconductor regions of the photoelectric conversion elements disposed adjacent to each other in the plurality of photoelectric conversion elements included in the different photoelectric conversion units disposed adjacent to each other.

16. The photoelectric conversion apparatus according to claim 15, wherein a third semiconductor region of the second conductivity type is disposed under the insulating material.

17. The photoelectric conversion apparatus according to claim 13, wherein each of the photoelectric conversion units includes a plurality of photoelectric conversion elements to which light condensed by one micro lens enters.

18. An imaging system having the photoelectric conversion apparatus according to claim 1, wherein imaging is performed with a signal acquired by adding signals of a plurality of photoelectric conversion elements included in the photoelectric conversion units; and a focus detection for the imaging is performed by using at least one signal of the signals of the plurality of photoelectric conversion elements included in the photoelectric conversion units.

19. The imaging system according to claim 18, wherein a focus detection is stopped if an amount of electric charges exceeds the amount that may be accumulated by one or more photoelectric conversion elements within the photoelectric conversion units.

20. An imaging system comprising the photoelectric conversion apparatus according to claim 13, wherein imaging is performed with a signal acquired by adding signals of a plurality of photoelectric conversion elements included in the photoelectric conversion units; and a focus detection for the imaging is performed by using at least one signal of the signals of the plurality of photoelectric conversion elements included in the photoelectric conversion units.

* * * * *